United States Patent
Kim et al.

(10) Patent No.: US 10,418,085 B2
(45) Date of Patent: Sep. 17, 2019

(54) MEMORY PLATE SEGMENTATION TO REDUCE OPERATING POWER

(71) Applicant: Micron Technology, Inc., Boise, ID (US)

(72) Inventors: Tae H. Kim, Boise, ID (US); Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/655,675

(22) Filed: Jul. 20, 2017

(65) Prior Publication Data

US 2019/0027204 A1 Jan. 24, 2019

(51) Int. Cl.
  *G11C 11/22* (2006.01)
  *G06F 1/3296* (2019.01)
  *G06F 1/3234* (2019.01)
  *G06F 1/3287* (2019.01)

(52) U.S. Cl.
  CPC ........ *G11C 11/2297* (2013.01); *G06F 1/3275* (2013.01); *G06F 1/3287* (2013.01); *G06F 1/3296* (2013.01); *G11C 11/221* (2013.01); *G11C 11/2255* (2013.01); *G11C 11/2257* (2013.01); *G11C 11/2273* (2013.01); *G11C 11/2275* (2013.01)

(58) Field of Classification Search
  CPC .............. G11C 11/2297; G11C 11/221; G11C 11/2275; G11C 11/2273; G11C 11/2255; G11C 11/2257
  See application file for complete search history.

(56) References Cited

U.S. PATENT DOCUMENTS

| | | |
|---|---|---|
| 5,373,463 A | 12/1994 | Jones, Jr. |
| 5,917,746 A | 6/1999 | Seyyedy |
| 5,995,406 A | 11/1999 | Kraus et al. |
| 6,873,536 B2 | 3/2005 | Komatsuzaki |
| 2003/0112650 A1* | 6/2003 | Kang ............... G11C 11/22 365/145 |
| 2005/0122765 A1* | 6/2005 | Allen ............... G11C 11/22 365/145 |
| 2007/0183191 A1 | 8/2007 | Kim |
| 2010/0110755 A1* | 5/2010 | Hashimoto ....... G11C 11/22 365/145 |

OTHER PUBLICATIONS

ISA/KR, International Search Report and Written Opinion of the International Searching Authority, Int'l. Appl. No. PCT/US2018/042875, dated Nov. 26, 2018, Korean Intellectual Property Office, Daejeon, Republic of Korea, 14 pgs.

* cited by examiner

*Primary Examiner* — Mohammed A Bashar
(74) *Attorney, Agent, or Firm* — Holland & Hart LLP

(57) ABSTRACT

Methods, systems, and devices for operating a ferroelectric memory cell or cells are described. An electronic memory device may include a plurality of plate portions separated by a plurality of segmentation lines, which may be oriented in a plane parallel to rows of a memory array or columns of the memory array, or both. The segmented plate may be employed instead of a single plate for the array. The one or more plate portions may be energized during access operations of a ferroelectric cell in order to create a voltage different across the cell or to facilitate changing the charge of the cell. Each of the plate portions may include one or more memory cells. The memory cells on a plate portion may be read from or written to after the plate portion is activated by a plate driver.

31 Claims, 14 Drawing Sheets

FIG. 1

MEMORY PLATE SEGMENTATION TO REDUCE OPERATING POWER

BACKGROUND

The following relates generally to memory devices and more specifically to electronic memory devices including a plurality of plate portions separated by a plurality of segmentation lines, and methods of use thereof.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information.

The advantages of non-volatile memory over volatile memory may be further increased if power consumption may be mitigated. Operating some non-volatile memories, such as FeRAM, may include energizing certain components to facilitate access operations. Limiting the size of such components, or limiting the frequency with which such components are energized, may help mitigate power consumption.

BRIEF DESCRIPTION OF THE DRAWINGS

The disclosure herein refers to and includes the following figures.

DETAILED DESCRIPTION

Figure 1:
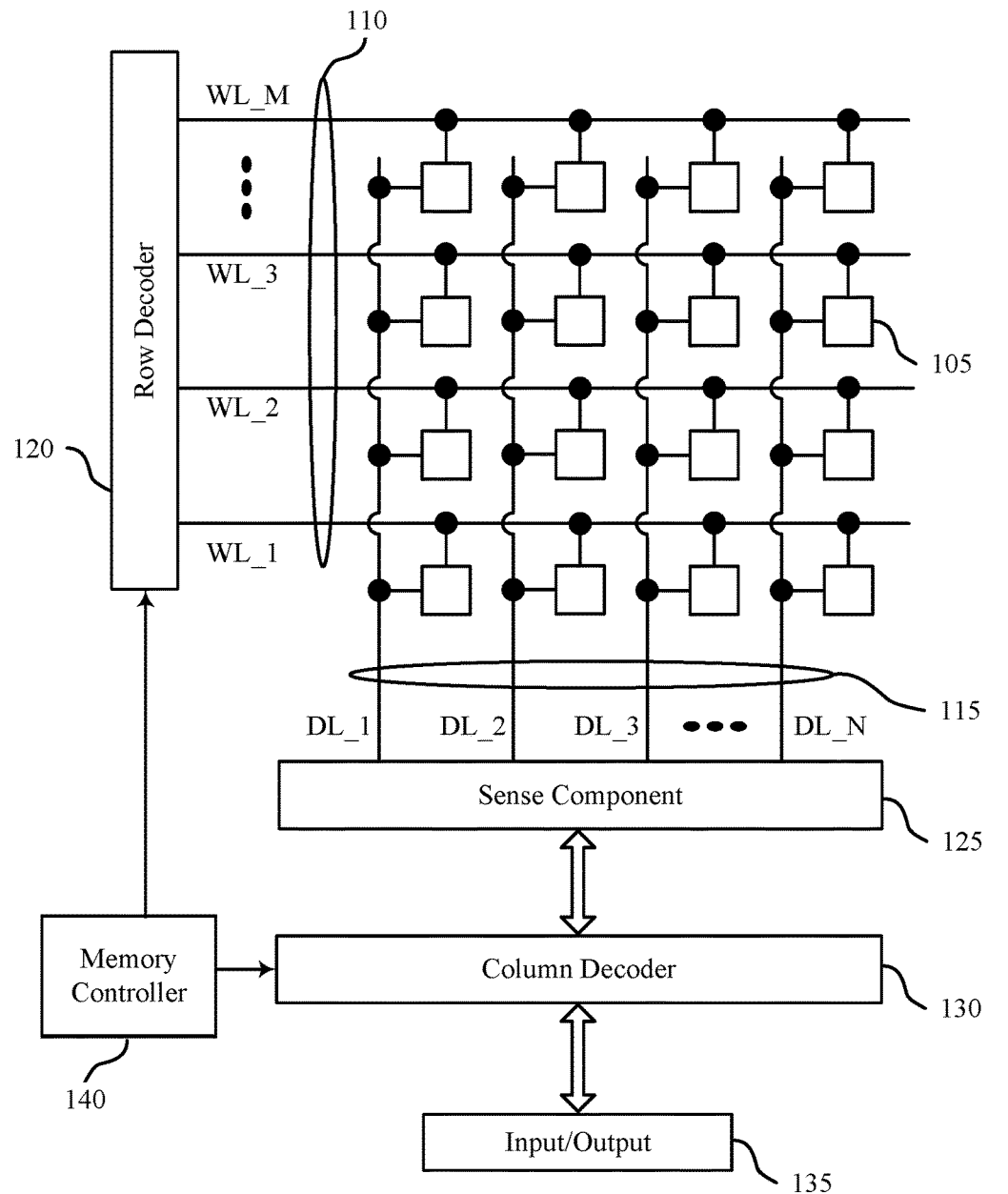
FIG. 1 illustrates an example memory array with memory plate segmentation in accordance with various embodiments of the present disclosure.

A memory array with ferroelectric cells may have a segmented plate, which may allow for subsections or portions of the plate to be energized to access cells associated with those portions. This may allow portions of the plate associated with unaccessed cells to remain isolated (i.e., not energized) and thus may mitigate or reduce power consumption relative to devices with a single plate.

By way of example, memory devices may consume a certain amount of power when a plate is activated to facilitate cell access (e.g., reading from or writing to a cell). Power consumption for plate activation may be increased due to parasitic capacitances, e.g., parasitic capacitances between the digit line and the word line, between the word line and the memory cell, and between the digit line and the memory cell. Parasitic capacitances may develop for each memory cell coupled to an activated memory plate, which may cause result in significant power consumption when a large number of memory cells are coupled to an activated memory plate.

In order to decrease the total parasitic capacitance, and therefore the power consumption, of an electronic memory cell, the electronic memory cell may include a plurality of memory plate portions separated by a plurality of segmentation lines. At least one memory cell may be disposed on each of the plurality of memory plate portions and may be coupled to a sense component via one of a plurality of digit lines. The memory cell may be, for example, a ferroelectric memory cell. The electronic memory cell may also include a plate driver component including a plurality of plate drivers, each plate driver being connected to at least one of the plurality of memory plate portions by a plate line.

In some examples, the plurality of segmentation lines include a first set of segmentation lines that are parallel to the plurality of digit lines. In some other examples, the plurality of segmentation lines include a first set of segmentation lines extending in a first direction and a second set of segmentation lines extending in a second direction perpendicular to the first direction. Segmentation lines, as used herein, may refer to physical breaks or discontinuities between portions of a plate; these may or may not be lines.

In some examples, each plate driver may be coupled to a single memory plate portion. In some other examples, each plate driver may be coupled to two or more memory plate portions. A plate driver may activate one or more of the memory plate portions so that information may be written to or read from the memory cells connected to the memory plate portions.

Features of the disclosure introduced above are further described below in the context of a memory array. Specific examples are then described for the configuration and operations of electronic memory devices with or that support memory plate segmentation to reduce operating power. These and other features of the disclosure are further illustrated by and described with reference to apparatus diagrams, system diagrams, and flowcharts that relate to memory plate segmentation.

FIG. 1 illustrates an example memory array 100 with memory plate segmentation in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a capacitor to store a charge representative of the programmable states; for example, a charged and uncharged capacitor may represent two logic states, respectively. Memory cell 105 may include a capacitor with a ferroelectric material. Ferroelectric materials have a spontaneous electric polarization—i.e., they have a non-zero polarization in the absence of an electric field. Different levels of charge of a ferroelectric capacitor may represent different logic states. Some details and advantages of a ferroelectric memory cell 105 are discussed below.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. In some examples, the memory cells 105 may be coupled to other lines in addition to a word line 110 and a digit line 115. For example, the memory cells 105 may be coupled to plate lines (not shown). The use and connections of plate lines are described below.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Figure 4:
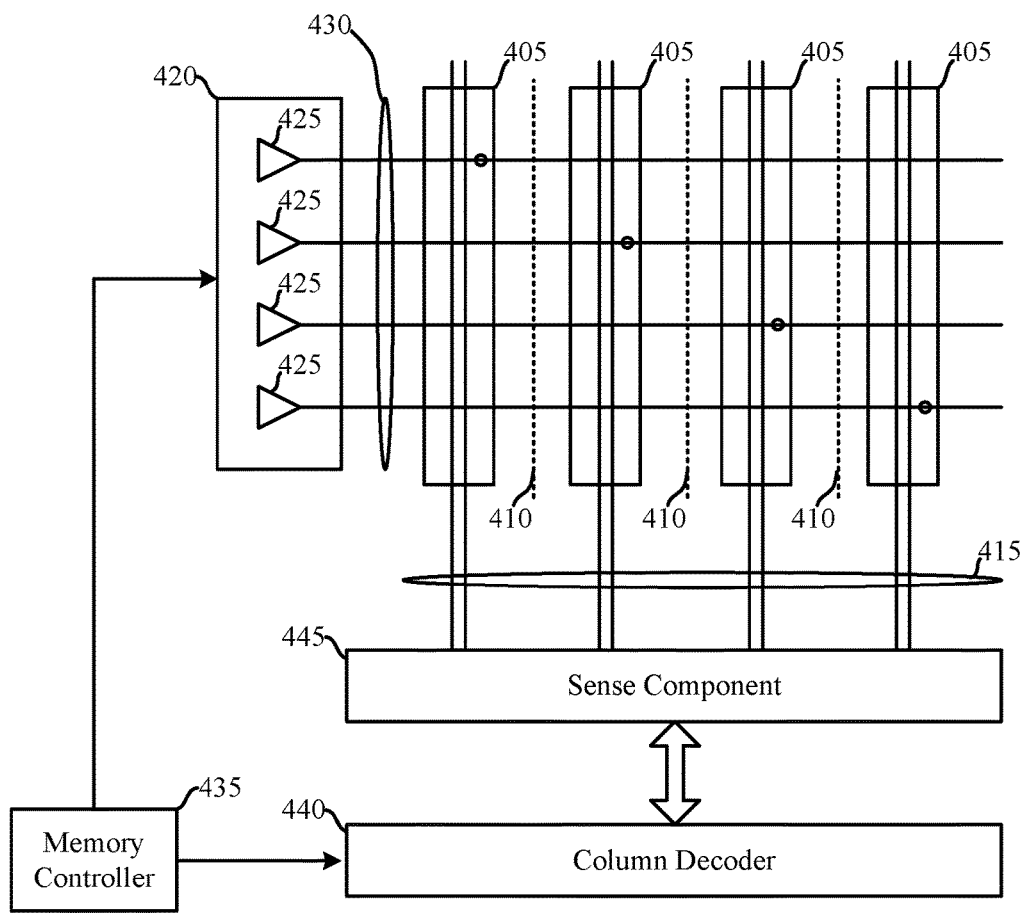
FIG. 4 illustrates an example memory array with memory plate segmentation in accordance with various embodiments of the present disclosure.
Figure 6:
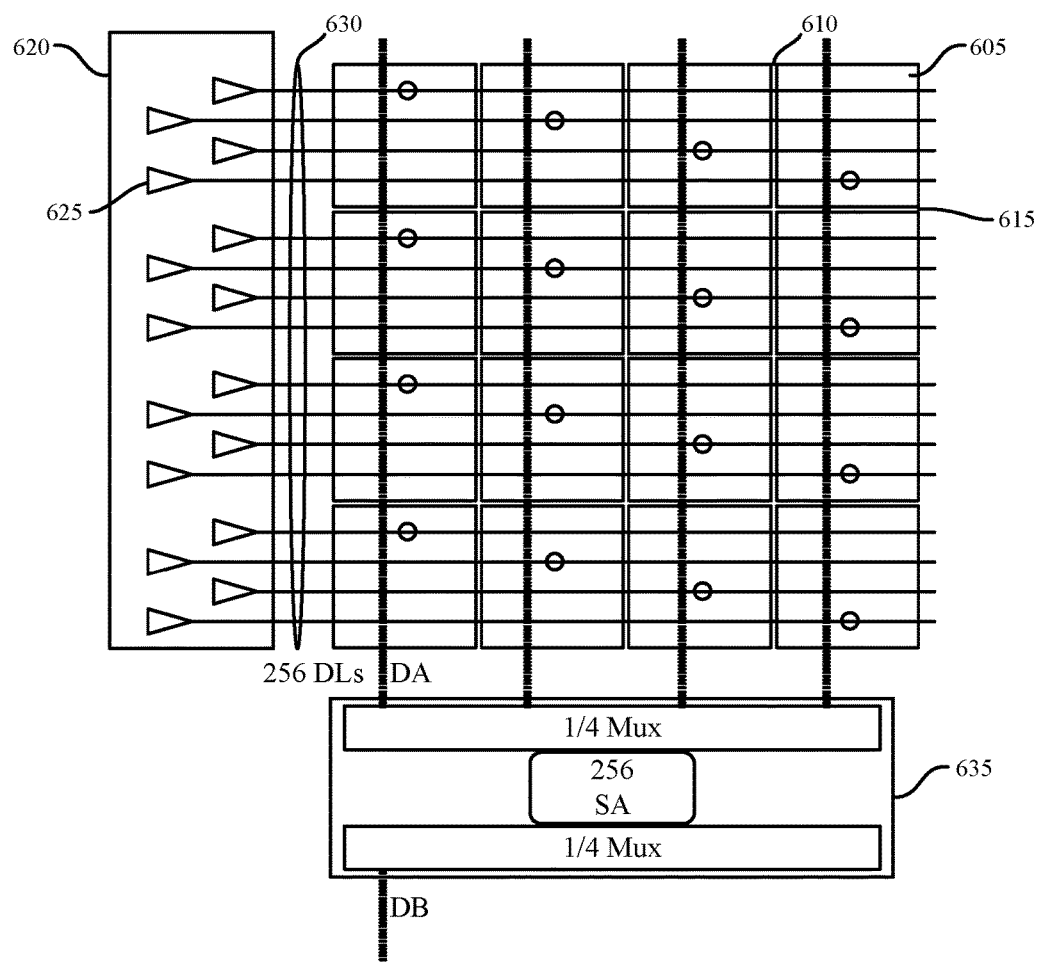
FIG. 6 illustrates an example memory array with memory plate segmentation in accordance with various embodiments of the present disclosure.

A plate may underlie an array of cells 105 as depicted in FIGS. 4 and 6, for example. The plate may be segmented in a plane parallel to word lines 110 or digit lines 115, or both. Each cell may be coupled to a portion of the plate, and the plate or portions of the plate may be activated or energized to access a cell to which that portion is coupled. As described herein, memory plate segmentation may avoid parasitic capacitance and thus decrease power consumption.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
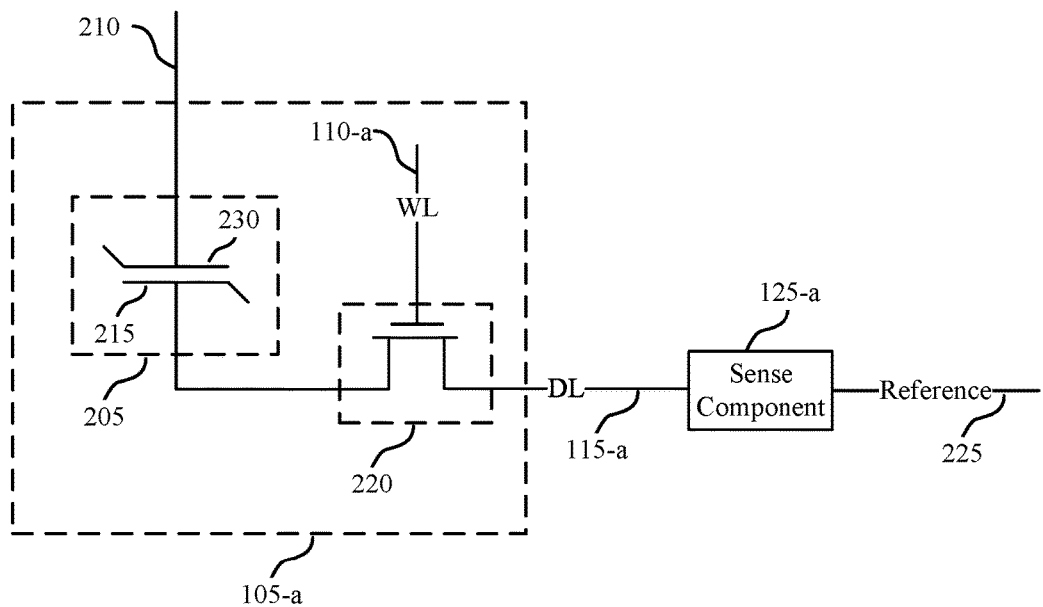
FIG. 2 illustrates an example circuit of a memory cell in a device with memory plate segmentation in accordance with various embodiments of the present disclosure.

FIG. 2 illustrates an example circuit 200 that includes a memory cell 105, which may be a component of a device with memory plate segmentation to in accordance with various embodiments of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 also includes selection component 220 and reference signal 225. In the example of FIG. 2, cell plate 230 may be accessed via plate line 210 and cell bottom 215 may be accessed via digit line 115-*a*. As described above, various states may be stored by charging or discharging capacitor 205.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate selection component 220; for example, a voltage applied to word line 110-*a* is applied to the transistor gate, connecting capacitor 205 with digit line 115-*a*. In an alternative embodiment, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground (i.e., "floating") prior to biasing plate line 210 and word line 110-*a*. Biasing plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may induce a change in the voltage of digit line 115-*a* based on the charge stored on capacitor 205. Operation of memory cell 105-*a* by varying the voltage to cell plate 230 may be referred to as "moving cell plate."

The change in voltage of digit line 115-*a* may depend on its intrinsic capacitance—as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF) or femtofarads (fF)). The resulting voltage of digit line 115-*a* may then be compared to a reference (e.g., a voltage of reference signal 225 line) by sense component 125-*a* in order to determine the stored logic state in memory cell 105-*a*.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference signal 225, which may be a reference voltage. The sense amplifier output may be driven to the higher (e.g., a positive) or lower (e.g., negative or ground) supply voltage based on the comparison. For instance, if digit line 115-*a* has a higher voltage than reference signal 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference signal 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

FIG. 3A and FIG. 3B illustrate examples of non-linear electrical properties with hysteresis curves 300-*a* (FIG. 3A) and 300-*b* (FIG. 3B) for a memory cell in a device with memory plate segmentation in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

Figure 3:
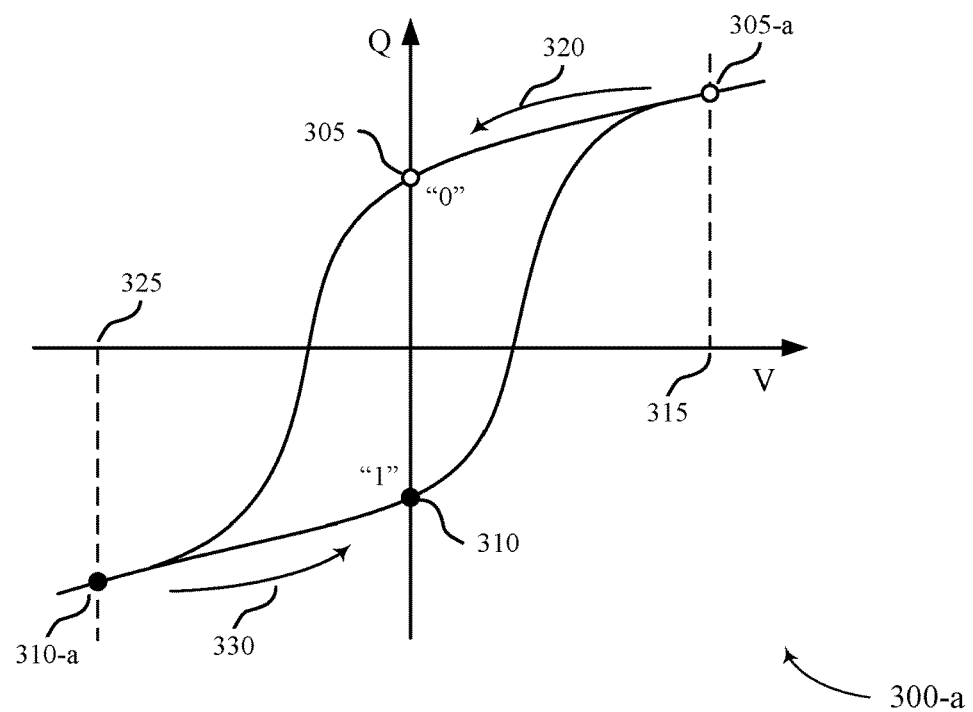
FIG. 3 illustrates example hysteresis plots for a ferroelectric memory cell in a device with memory plate segmentation in accordance with various embodiments of the present disclosure.
Figure 3:
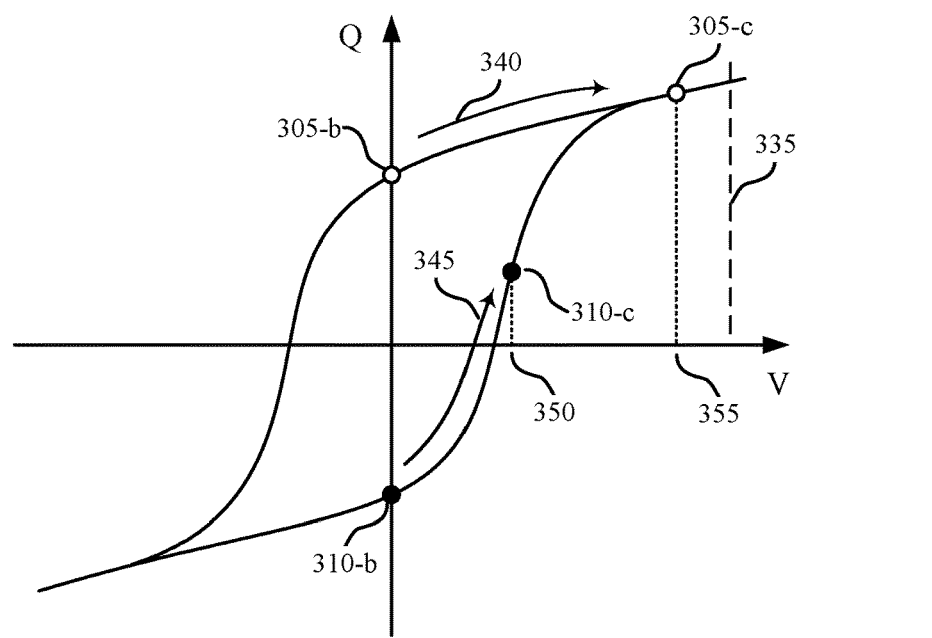

The non-linear characteristics described with reference to FIG. 3 may give rise to beneficial non-volatile memory properties described herein. Operating a ferroelectric cell with such properties, however, may implicate considerations related to energizing a plate, parasitic capacitance, and the like. So in operating a ferroelectric cell, both the characteristics of the cell (examples of which are described with reference to FIG. 3), and the circuit components enabling such operation, such as segmented or non-segmented plates, may be considered.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305 and 310 may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335–voltage 350) or (voltage 335–voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335–voltage 350) and (voltage 335–voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

FIG. 4 illustrates an example memory array 400 with memory plate segmentation in accordance with various embodiments of the present disclosure. The memory array 400 may include a plurality of plate portions 405 separated by a plurality of segmentation lines 410. The segmentation lines 410 may, in some embodiments, extend in a first direction. In some cases, the first direction may be a vertical direction. Each of the plurality of plate portions 405 can include a plurality of memory cells, which may be examples of aspects of memory cell 105 as described with reference to FIG. 1 or memory cell 105-a as described with reference to FIG. 2. Each of the memory cells may be accessed by applying a voltage to word lines (not shown) and digit lines 415, as described with reference to FIG. 1. The word lines and digit lines 415 may be examples of word lines 110 and digit lines 115 as described with reference to FIG. 1. While a single line is shown coupled to each plate portion 405 in FIG. 4, a person having skill in the art will understand that each plate portion 405 may be coupled to a plurality of digit lines 415, and that each line therefore may represent a plurality of digit lines. For example, in some examples each plate portion 405 may have 256 digit lines 415 coupled thereto.

Each of the plurality of plate portions 405 may be activated by a plate driver component 420. The plate driver component 420 may include a plurality of plate drivers 425 with each plate driver 425 configured to activate one of the plurality of plate portions 405. Each of the plate drivers 425 may be connected to a plate portion 405 via a plate line 430. Plate lines 430 may be examples of aspects of plate line 210 as described with reference to FIG. 2. The plate driver 425 may activate the plate portion 405 by applying a voltage to the corresponding plate line 430. The plate driver component 420 may, in some cases, be located at a different position of possible positions relative to the sense component 445, the column decoder 440, or both. In some embodiments, the plate driver component 420 may be located as shown in FIG. 4. In some other embodiments, the plate driver component 420 may be located on a same side of the memory array 400 as the sense component 445 and/or the column decoder 440. In some other embodiments, the plate driver component 420 may be located on an opposite side of the memory array 400 as the sense component 445 and/or the column decoder 440.

The memory array 400 may include a number of additional components including a memory controller 435, a row decoder (not shown), a column decoder 440, and a sense component 445. Memory controller 435, row decoder, column decoder 440, and sense component 445 may be examples of aspects of memory controller 140, row decoder 120, column decoder 130, and sense component 125, respectively, as described with reference to FIG. 1. In some examples, sense component 125 may include a multiplexer coupled to a plurality of sense amplifiers to select digit lines 415 from the selected plate portion 405.

When information is to be read from or written to the memory array, a memory controller 435 may identify a target memory cell from the plurality of memory cells in the memory array 400. The target memory cell may be, for example, a memory cell containing information a user desires to read from the memory array 400 or an unused memory cell that can be used to store information a user desires to write to the memory array 400. The memory controller 435 may identify a location of the target memory cell in the memory array 400. The memory controller 435 may then cause the plate driver component 420 to activate a single plate portion 405 corresponding to the location of the target memory cell. In some embodiments, the plate driver component 420 may activate the plate portion 405 by using one of the plurality of plate drivers 425 to apply a voltage to a plate line 430 corresponding to the location of the target memory cell. In some embodiments, the plate driver component 420 may not activate the other plate portions 405 other than the plate portion 405 corresponding to the location of the target memory cell. That is, the plate driver component 420 may only activate the plate portion 405 corresponding to the location of the target memory cell, but may not activate any other plate portions. The plate driver 420 may set the other plate portions 405 to a deactivated state (which may include maintaining those plate portions 405 in the deactivated state). The memory controller 435 may cause a row decoder to activate a selection component (not shown) corresponding to the location of the target memory cell to connect the target memory cell to one of the digit lines 415. The selection component may be an example of aspects of selection component 220 as described with reference to FIG. 2. The memory controller can then read from or write to the target memory cell via column decoder 440 and sense component 445, as described with reference to FIG. 1.

In some examples, the memory array 400 may include one or more dummy lines. For example, the plurality of word lines in memory array 400 can include one or more dummy word lines. The dummy word lines may be located adjacent an edge of at least one of the plate portions 405. The dummy word lines may be electrically isolated from the memory cells of the memory array 400. For example, each of the dummy word lines may not be connected to any of the memory cells on any of the plate portions 405. Dummy word lines may be utilized to address design issues. For example, if the cell pitch of a plate is 2F, the plate line spacing may be increased from F to 3F by adding a dummy word line. In some examples, the plurality of digit lines may likewise include one or more dummy digit lines located adjacent an edge of at least one of the plate portions 405 and electrically isolated from the memory cells of the memory array 400.

Figure 5:
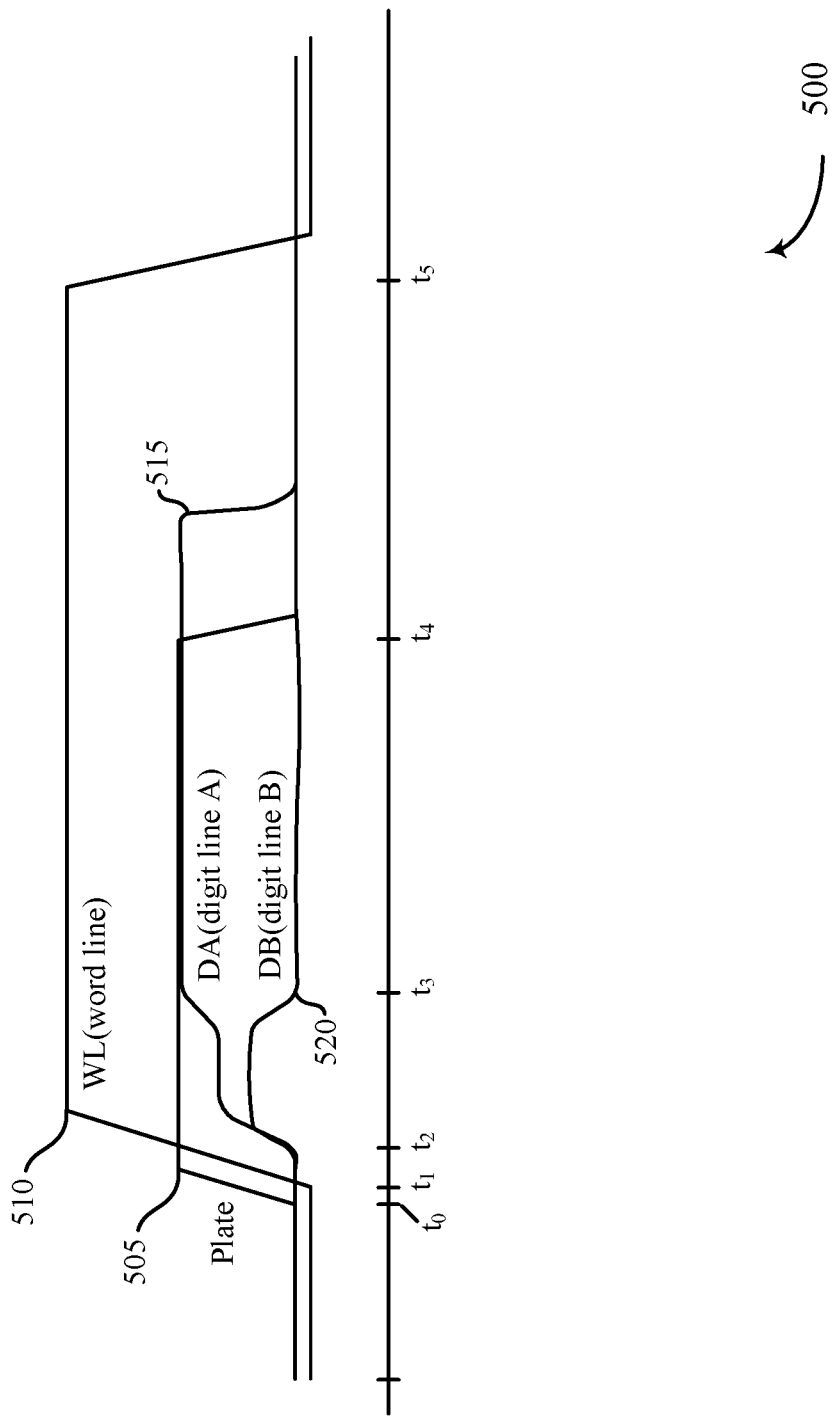
FIG. 5 illustrates an example timing diagram for a memory array with memory plate segmentation in accordance with various embodiments of the present disclosure.

FIG. 5 illustrates an example timing diagram 500 for a memory array with memory plate segmentation in accordance with various embodiments of the present disclosure. The memory array may be an example of aspects of memory array 400 as described with reference to FIG. 4.

Timing diagram 500 includes a plate signal 505 corresponding to a first voltage at a plate line, which may be an example of aspects of a plate line 430 as described with reference to FIG. 4. Timing diagram further includes a word line signal 510 corresponding to a second voltage at a word line, which may be an example of aspects of a word line 110 as described with reference to FIG. 1. Timing diagram further includes a digit line signal 515 corresponding to a third voltage at a digit line, which may be an example of aspects of a digit line 415 as described with reference to FIG. 4. For example, the digit line signal 515 may indicate the voltage at a location denoted digit line A (DA) as shown in FIG. 6. Timing diagram also includes an input/output signal 520 corresponding to a fourth voltage at an input/output of a sense component, which may be an example of a sense component 445 as described with reference to FIG. 4. For example, the input/output signal 520 may indicate the voltage at a location denoted digit line B (DB) as shown in FIG. 6.

At time t0, a plate portion is activated by applying a voltage to the plate line. Accordingly, plate signal 505 increases based on the voltage applied to the plate line by, for example, a plate driver. At time t1, a voltage is applied to the word line, which increases second voltage on the word line signal 510. The application of a voltage to the word line results in the memory cell being connected to the digit line, as described with reference to FIG. 2. The digit line signal 515 accordingly increases at time t2. The sense component then compares the third voltage of the digit line signal 515 to a reference signal and determines that the third voltage corresponds to a logic "0" at time t3. The read operation is then complete. The plate is deactivated by dropping the voltage of the plate signal 505 to zero at time t4, and the word line signal 510 is likewise dropped to zero at time t5. Thereafter, data can be read from or written to another memory cell in the memory array.

In some examples, the plate lines coupled to unaddressed lines (not shown) may not be biased when the selected cell is being accessed. Accordingly, the power consumption may be decreased in comparison to systems in which unaddressed lines are biased, because the power consumption is limited to the biasing of the selected plate lines, while avoiding power consumption that would otherwise be related to biasing of the plate lines coupled to the unaddressed lines. In some embodiments, the lack of biasing to unaddressed cells may also reduce electrical disturbance to the unaddressed cells.

FIG. 6 illustrates an example memory array 600 with memory plate segmentation in accordance with various embodiments of the present disclosure. The memory array 600 may include a plurality of plate portions 605 separated by a plurality of segmentation lines including a first group of segmentation line 610 extending in a first direction (e.g., a vertical direction) and a second group of segmentation lines 615 extending in a second direction (e.g., a horizontal direction). Each of the plurality of plate portions 605 may include a plurality of memory cells, which may be examples of aspects of memory cell 105 as described with reference to FIG. 1 or memory cell 105-a as described with reference to FIG. 2. The memory cells can be access by applying voltages to word lines and digit lines as described with reference to FIG. 1.

Each of the plurality of plate portions 605 may be activated by a plate driver component 620. The plate driver component 620 may include a plurality of plate drivers 625 with each plate driver 625 coupled to and configured to activate one of the plurality of plate portions 605. Each of the plate drivers 625 may be connected to a plate portion 605 via a plate line 630. Plate lines 630 may be examples of aspects of plate line 210 as described with reference to FIG. 2. The plate driver 625 may activate the plate portion 605 by applying a voltage to the corresponding plate line 630. The plate driver component 620 may, in some cases, be located at a different position of possible positions relative to the sense component 635. In some embodiments, the plate driver component 620 may be located as shown in FIG. 6. In some other embodiments, the plate driver component 620 may be located on a same side of the memory array 600 as the sense component 635. In some other embodiments, the plate driver component 620 may be located on an opposite side of the memory array 600 as the sense component 635.

The memory array 600 may include additional components such as a sense component 635 as well as row decoders, column decoders, and memory controller such as row decoder 120, column decoder 130, and memory controller 140, respectively, as described with reference to FIG. 1. Data may be written to and read from memory array 600 as described with reference to FIG. 4. However, the power consumption of memory array 600 may be reduced in comparison with the power consumption of memory array 400. For example, the power consumption of memory array 600 may be approximately 25% of the power consumption of memory array 400.

Figure 7:
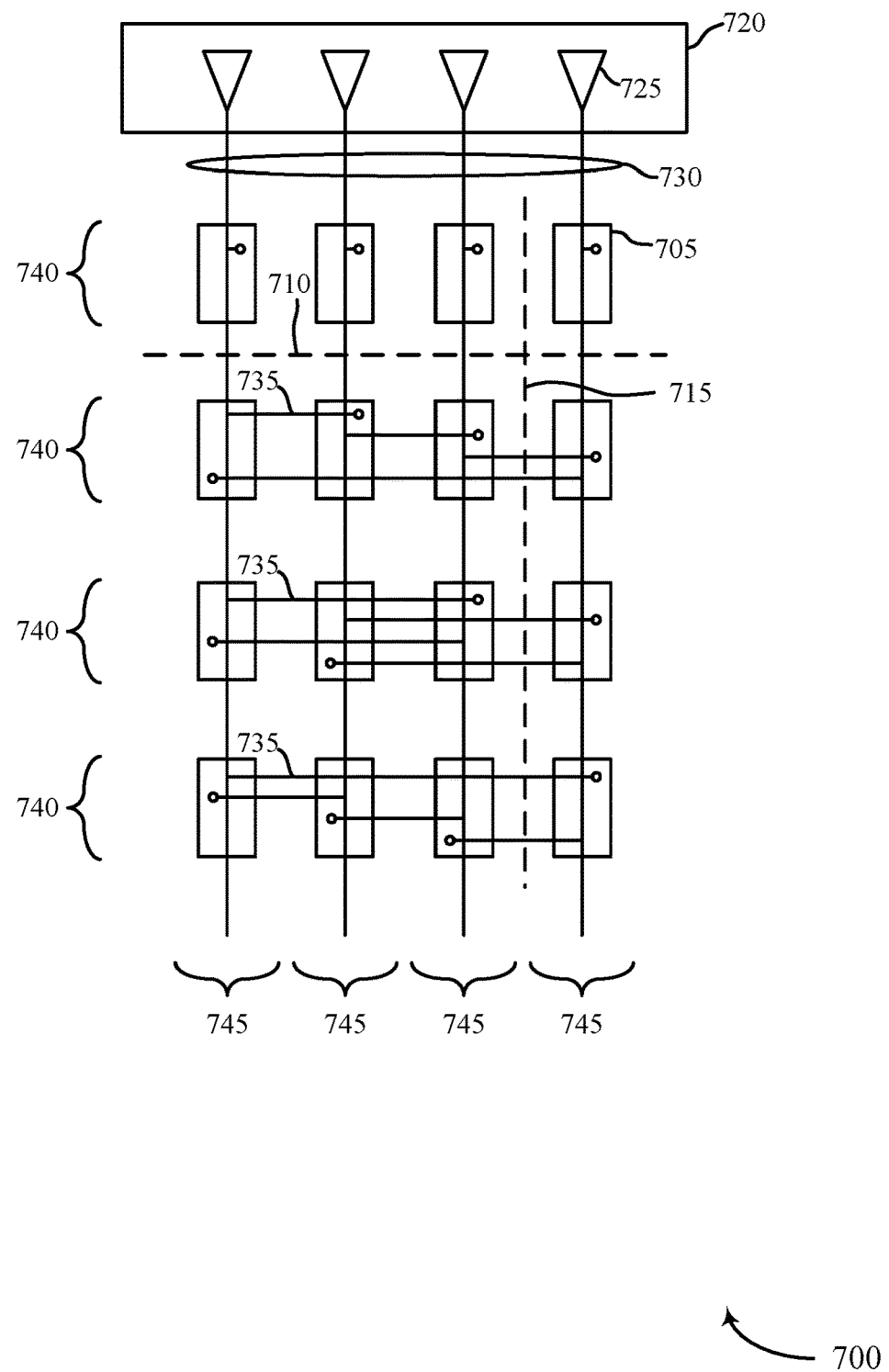
FIG. 7 illustrates an example memory array with memory plate segmentation in accordance with various embodiments of the present disclosure.

FIG. 7 illustrates an example memory array 700 with memory plate segmentation in accordance with various embodiments of the present disclosure. The memory array 700 may include a plurality of plate portions 705 separated by a plurality of segmentation lines including a first group of segmentation line 710 extending in a first direction (e.g., a vertical direction) and a second group of segmentation lines 715 extending in a second direction (e.g., a horizontal direction). Each of the plurality of plate portions 705 may include a plurality of memory cells, which may be examples of aspects of memory cell 105 as described with reference to FIG. 1 or memory cell 105-a as described with reference to FIG. 2. The memory cells can be access by applying voltages to word lines and digit lines as described with reference to FIG. 1.

Each of the plurality of plate portions 705 may be activated by a plate driver component 720. The plate driver component 720 may include a plurality of plate drivers 725 with each plate driver 725 coupled to and configured to activate one of the plurality of plate portions 705. Each of the plate drivers 725 may be connected to several plate portions 705. For example, each plate driver 725 may be coupled to a plate driver line 730. The plate driver line 730 may be coupled to plate lines 735 on a plurality of plate portions 705. Plate lines 735 may be examples of aspects of plate line 210 as described with reference to FIG. 2. The plate driver 725 may activate each of the plate portions 705 to which it is coupled by applying a voltage to the plate driver line 730. The plate driver line 730 may be coupled to plate driver lines 730 connected to plate portions 705 in every row 740 of the memory array 600. In some examples, a plate driver line 730 may be coupled to plate portions 705 in at least two columns 745. For example, a plate driver line 730 may be coupled to plate portions 705 in every column 745 such that applying a voltage to plate driver line 730 will activate plate portions 705 in every column 745.

The memory array 700 may include additional components such as a sense component, row decoder, column decoder, and memory controller, which may be examples of aspects of sense component 125, row decoder 120, column decoder 130, and memory controller 140, respectively, as described with reference to FIG. 1. Data may be written to and read from memory array 700 as described with reference to FIGS. 1 and 4.

In some examples, the memory array 700 may include one or more dummy lines. For example, the plurality of word lines in memory array 700 can include one or more dummy word lines. The dummy word lines may be located adjacent an edge of at least one of the plate portions 705. The dummy word lines may be electrically isolated from the memory cells of the memory array 700. For example, each of the dummy word lines may not be connected to any of the memory cells on any of the plate portions 705. Dummy word lines may be utilized to address design issues. For example, if the cell pitch of a plate is 2F, the plate line spacing may be increased from F to 3F by adding a dummy word line. In some examples, the plurality of digit lines may likewise include one or more dummy digit lines located adjacent an edge of at least one of the plate portions 705 and electrically isolated from the memory cells of the memory array 700.

Figure 8:
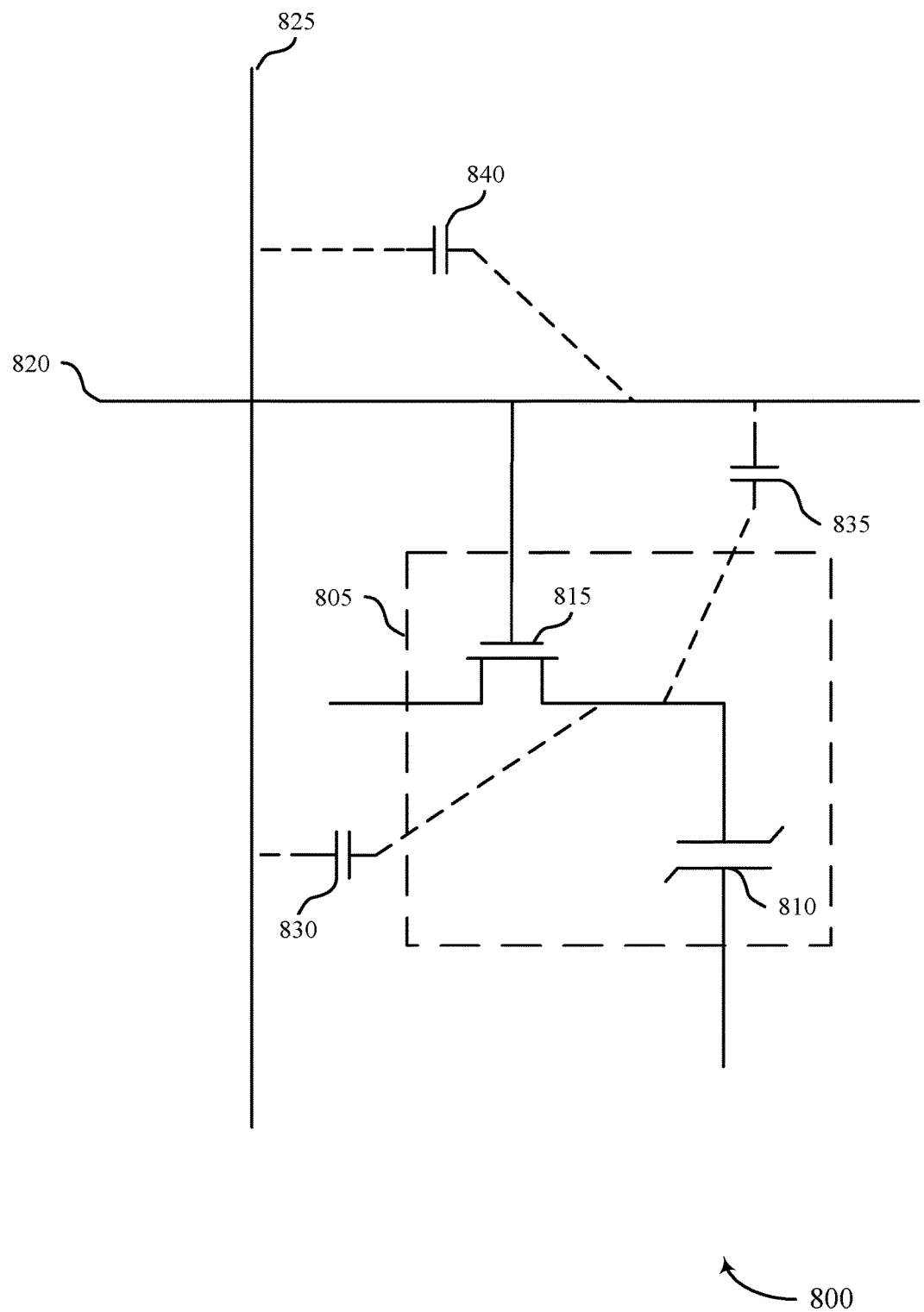
FIG. 8 illustrates an example circuit in a memory array with memory plate segmentation in accordance with various embodiments of the present disclosure.

FIG. 8 illustrates an example circuit diagram 800 for a memory cell in a memory array with memory plate segmentation in accordance with various embodiments of the present disclosure. The circuit diagram may include a memory cell 805 including a memory plate 810 and a selection component 815. The memory cell 805 may be coupled to a word line 820 and a digit line 825. Memory cell 805, word line 820, and digit line 825 may be examples of aspects of memory cell 105, word line 110, and digit line 115 as described with reference to FIG. 1. Memory plate 810 may be an example of aspects of a plate portion 405 as described with reference to FIG. 4. Selection component 815 may be an example of aspects of selection component 220 described with reference to FIG. 2.

When memory plate 810 is activated, parasitic capacitances may be generated. For example, a first parasitic capacitance 830 may be generated between the digit line 825 and the memory cell 805, a second parasitic capacitance 835 may be generated between the word line 820 and the memory cell 805, and a third parasitic capacitance 840 may be generated between the word line 820 and the digit line 825. The first parasitic capacitance 830, second parasitic capacitance 835, and third parasitic capacitance 840 may be generated for each memory cell coupled to the memory plate 810 when the memory plate 810 is activated. The combination of the first parasitic capacitance 830, the second parasitic capacitance 835, and the third parasitic capacitance 840 may be considered the parasitic load for the memory plate 810. Power consumption may be reduced by reducing the number of memory cells coupled to an activated memory plate, and thereby reducing the number of parasitic loads.

For example, an electronic memory device having 4,096 memory cells may have a single memory plate. In such an example, when the memory plate is activated, the memory device may have 4,096 parasitic loads. In some other examples, the memory device may have four separate memory plates as described, for example, with reference to FIG. 4. In such examples, when one of the four memory plates is activated, the memory device may have 1,024 parasitic loads, reducing the power consumption due to parasitic capacitance by 75% as compared with using a single plate. The other three memory plates are not activated. In some other examples, the memory device may have sixteen separate memory plates as described, for example, with reference to FIG. 6. In such examples, when one of the sixteen memory plates is activated, the memory device may have 256 parasitic loads, and thus the power consumption due to parasitic capacitance will be $1/16$th the power consumption of a memory device with a single plate. The other fifteen memory plates are not activated.

Figure 9:
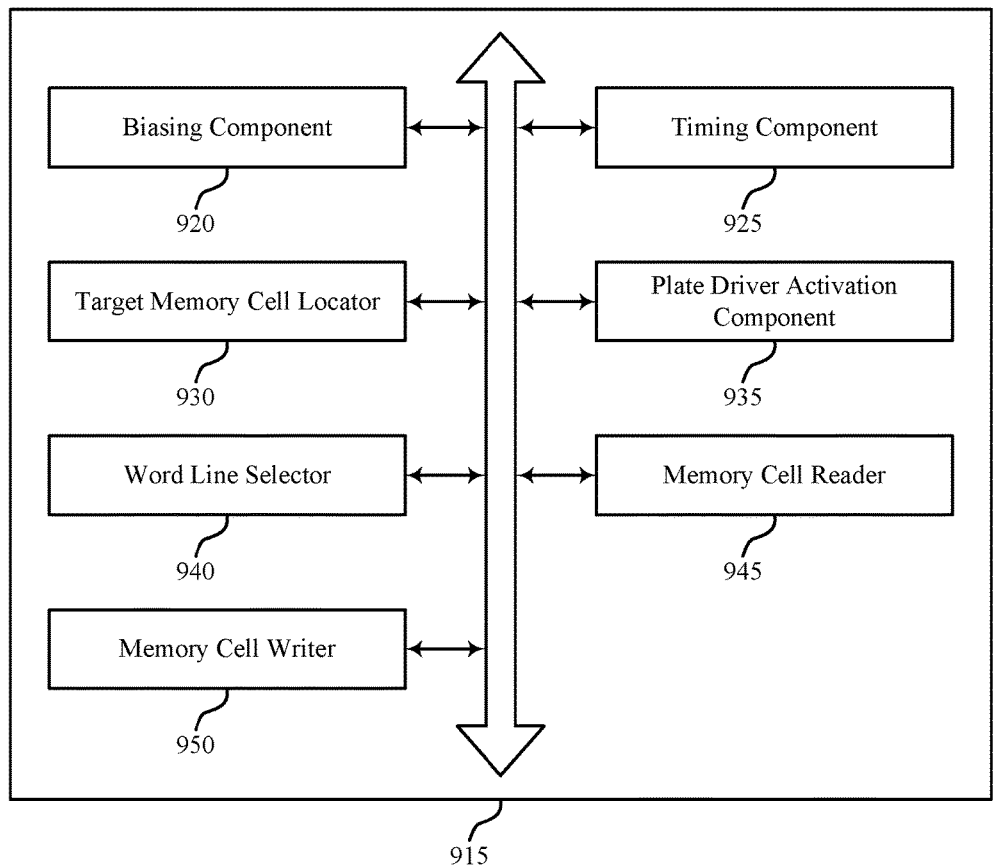
FIG. 9 illustrates an example memory controller that supports operations for a device with memory plate segmentation in accordance with various embodiments of the present disclosure.

FIG. 9 shows a block diagram 900 of a memory controller 915 that supports operation of a device with memory plate segmentation in accordance with embodiments of the present disclosure. The memory controller 915 may be an example of a memory controller 140 described with reference to FIG. 1 or FIG. 10, or both. The memory controller 915 may include biasing component 920, timing component 925, target memory cell locator 930, plate driver activation component 935, word line selector 940, memory cell reader 945, and memory cell writer 950. Each of these modules may communicate, directly or indirectly, with one another (e.g., via one or more buses).

Target memory cell locator 930 may determine a location of a target memory cell. A target memory cell may be a memory cell 105 described with reference to the preceding figures.

Plate driver activation component 935 may activate a plate portion corresponding to the location of the target memory cell, the plate portion being separated from a set of other plate portions by segmentation lines, the segmentation lines including a first set of segmentation lines extending in a vertical direction. The plate driver activation component 935 may activate the plate portion by sending instructions to a plate driver to apply a first voltage to a plate line coupled to the plate portion. The plate driver activation component 935 may activate a plate portion corresponding to the location of the target memory cell, the plate portion being separated from a set of other plate portions by segmentation lines, the segmentation lines including a first set of segmentation lines extending in a first direction and a second set of segmentation lines extending in a second direction perpendicular to the first direction. The plate driver activation component 935 may activate the plate portion by sending instructions to a plate driver to apply a first voltage to a plate line coupled to the plate portion. In some examples, no voltage may be applied to plate portions associated with unaddressed memory cells Word line selector 940 may apply a first voltage to a word line coupled to a memory cell disposed on the plate portion to connect the target memory cell to a digit line extending in the first direction.

Memory cell reader 945 may determine a logic value associated with the target memory cell based on a second voltage on the digit line.

Memory cell writer 950 may apply a second voltage to the digit line to set a logic value associated with the target memory cell.

Figure 10:
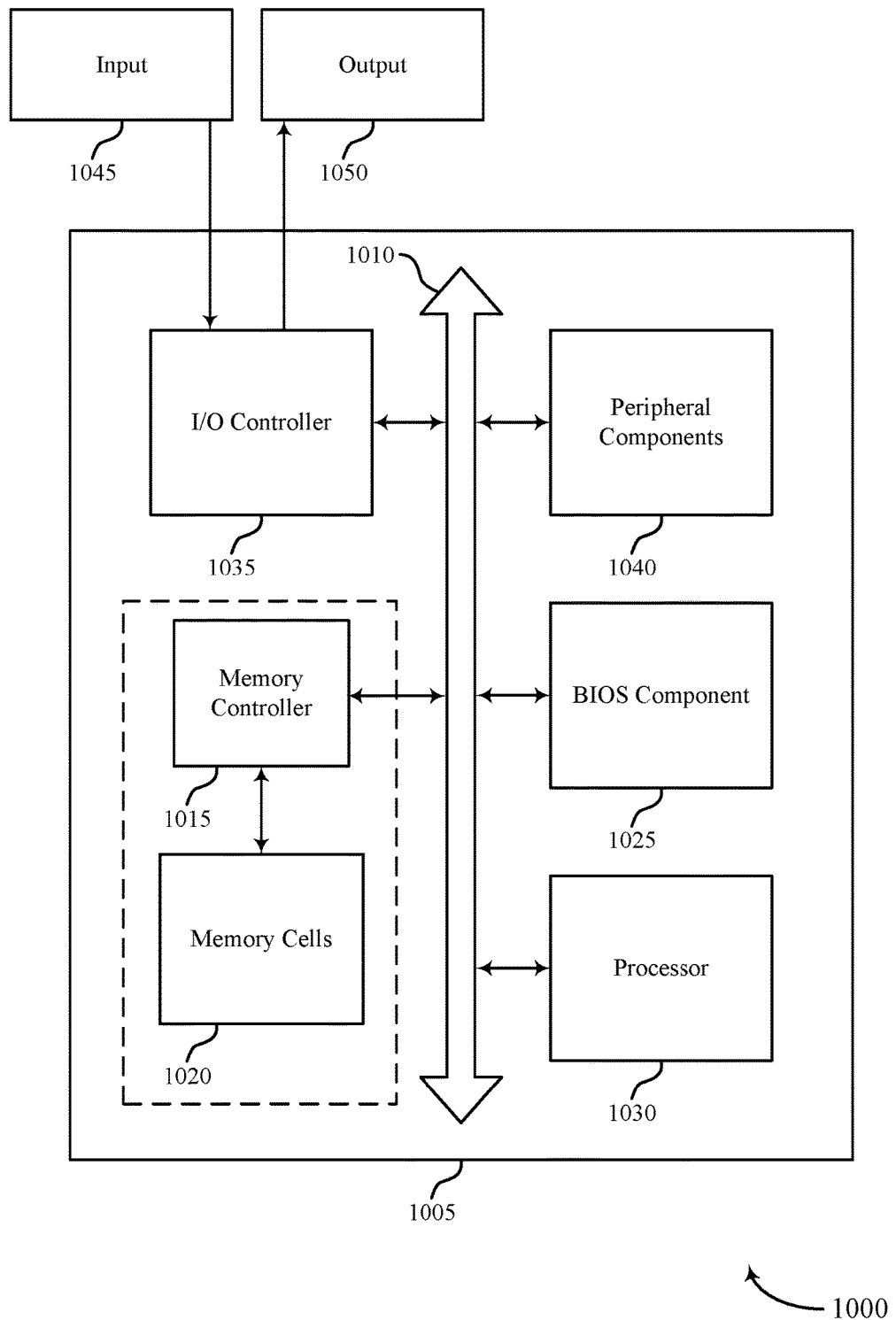
FIG. 10 illustrates a system including an electronic memory device with memory plate segmentation in accordance with various embodiments of the present disclosure.

FIG. 10 shows a diagram of a system 1000 including a device 1005 with memory plate segmentation in accordance with embodiments of the present disclosure. Device 1005 may include components for bi-directional voice and data communications including components for transmitting and receiving communications, including memory controller 1015, memory cells 1020, basic input/output system (BIOS) component 1025, processor 1030, I/O controller 1035, and peripheral components 1040. These components may be in electronic communication via one or more busses (e.g., bus 1010).

Memory controller 1015 may be an example of or include the components of memory controller 140 as described above, e.g., with reference to FIG. 1 or 9. Memory cells 1020 may store information (i.e., in the form of a logical state) as described herein.

BIOS component 1025 be a software component that includes BIOS operated as firmware, which may initialize and run various hardware components. BIOS component 1025 may also manage data flow between a processor and various other components, e.g., peripheral components, input/output control component, etc. BIOS component 1025 may include a program or software stored in read only memory (ROM), flash memory, or any other non-volatile memory.

Processor 1030 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1030 may be configured to operate a memory array using a memory controller. In other cases, a memory controller may be integrated into processor 1030. Processor 1030 may be configured to execute computer-readable instructions stored in a memory to perform various functions (e.g., functions or tasks supporting memory plate segmentation to reduce operating power).

I/O controller 1035 may manage input and output signals for device 1005. I/O controller 1035 may also manage peripherals not integrated into device 1005. In some cases, I/O controller 1035 may represent a physical connection or port to an external peripheral. In some cases, I/O controller 1035 may utilize an operating system such as iOS®, ANDROID®, MS-DOS®, MS-WINDOWS®, OS/2®, UNIX®, LINUX®, or another known operating system. In other cases, I/O controller 1035 may represent or interact with a modem, a keyboard, a mouse, a touchscreen, or a similar device. In some cases, I/O controller 1035 may be implemented as part of a processor. In some cases, a user may interact with device 1005 via I/O controller 1035 or via hardware components controlled by I/O controller 1035.

Peripheral components 1040 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1045 may represent a device or signal external to device 1005 that provides input to device 1005 or its components. This may include a user interface or an interface with or between other devices. In some cases, input 1045 may be managed by I/O controller 1035, and may interact with device 1005 via a peripheral component 1040.

Output 1050 may also represent a device or signal external to device 1005 configured to receive output from device 1005 or any of its components. Examples of output 1050 may include a display, audio speakers, a printing device, another processor or printed circuit board, etc. In some cases, output 1050 may be a peripheral element that interfaces with device 1005 via peripheral component(s) 1040. In some cases, output 1050 may be managed by I/O controller 1035

The components of device 1005 may include circuitry designed to carry out their functions. This may include various circuit elements, for example, conductive lines, transistors, capacitors, inductors, resistors, amplifiers, or other active or inactive elements, configured to carry out the functions described herein. Device 1005 may be a computer, a server, a laptop computer, a notebook computer, a tablet computer, a mobile phone, a wearable electronic device, a personal electronic device, or the like. Or device 1005 may be a portion or aspect of such a device.

Figure 11:
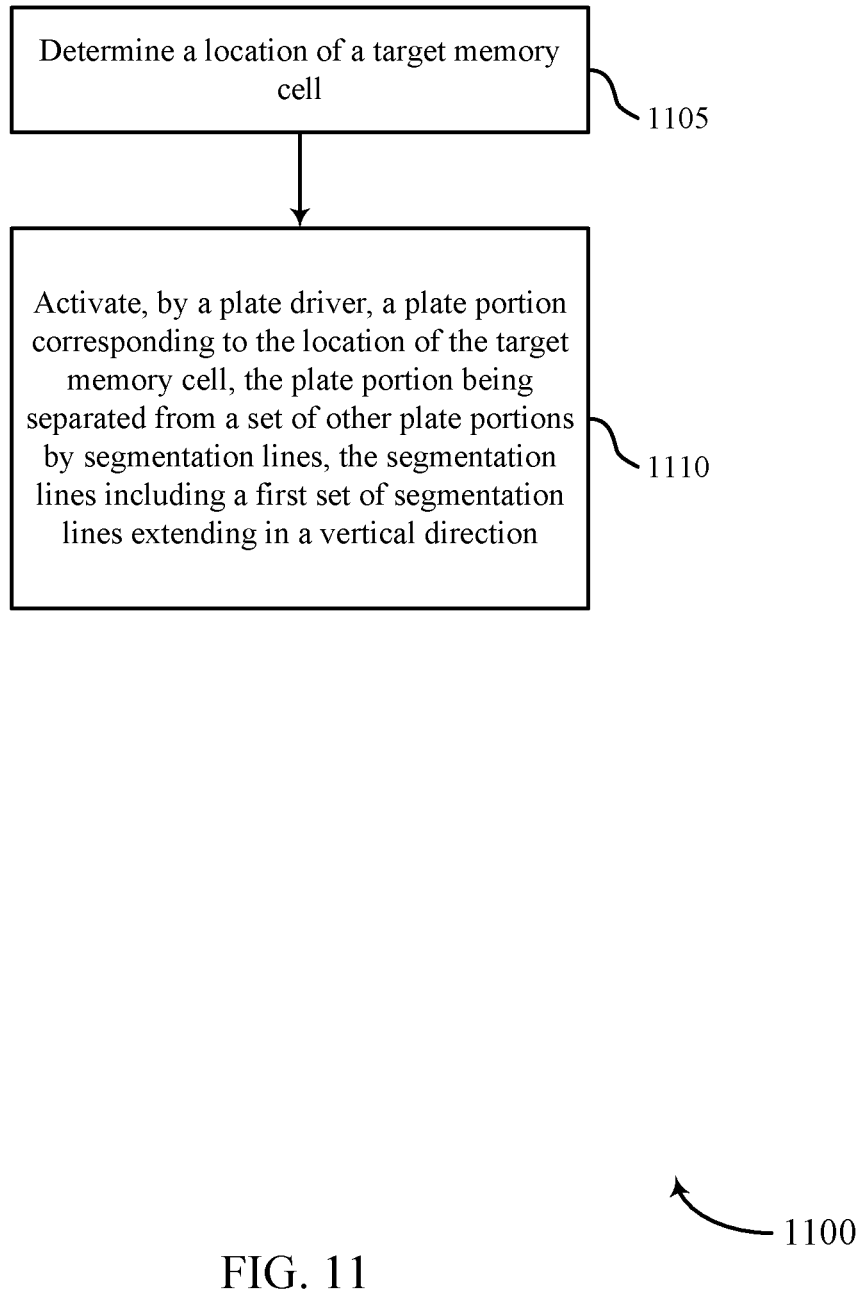
FIGS. 11-14 illustrate methods for operating a device with memory plate segmentation in accordance with embodiments of the present disclosure.

FIG. 11 shows a flowchart illustrating a method 1100 for operating a device with memory plate segmentation in accordance with embodiments of the present disclosure. The operations of method 1100 may be implemented by a memory controller 140 or its components as described herein. For example, the operations of method 1100 may be performed by a memory controller 140 as described with reference to FIGS. 1 and 10. In some examples, a memory controller 140 may execute a set of codes to control the functional elements of the device to perform the functions described below. Additionally or alternatively, the memory controller 140 may perform aspects of the functions described below using special-purpose hardware.

In some cases, the method may also include determining a location of a target memory cell. In some cases, the method may also include activating, by a plate driver, a plate portion corresponding to the location of the target memory cell, the plate portion being separated from a plurality of other plate portions by segmentation lines, the segmentation lines comprising a first set of segmentation lines extending in a vertical direction. In some cases, the method may also include activating the plate portion comprises applying a first voltage to a plate line coupled to the plate portion. In some cases, the method may also include applying a first voltage to a word line coupled to a memory cell disposed on the plate portion to connect the target memory cell to a digit line extending in the vertical direction. In some cases, the method may also include determining a logic value associated with the target memory cell based on a second voltage on the digit line. In some cases, the method may also include applying a second voltage to the digit line to set a logic value associated with the target memory cell.

At block 1105 the memory controller 140 may determine a location of a target memory cell. The operations of block 1105 may be performed according to the methods described herein. In certain examples, aspects of the operations of block 1105 may be performed by a target memory cell locator as described with reference to FIGS. 4, 6, 7, 9, and 10.

At block 1110 the memory controller 140 may activate a plate portion corresponding to the location of the target memory cell, the plate portion being separated from a plurality of other plate portions by segmentation lines, the segmentation lines comprising a first set of segmentation lines extending in a vertical direction. The memory controller 140 may activate the plate portion by sending instructions to a plate driver to apply a voltage to the plate portion corresponding to the location of the target memory cell. The operations of block 1110 may be performed according to the methods described herein. In certain examples, aspects of the operations of block 1110 may be performed by a plate driver activation component as described with reference to FIGS. 4, 6, 7, 9, and 10.

Figure 12:
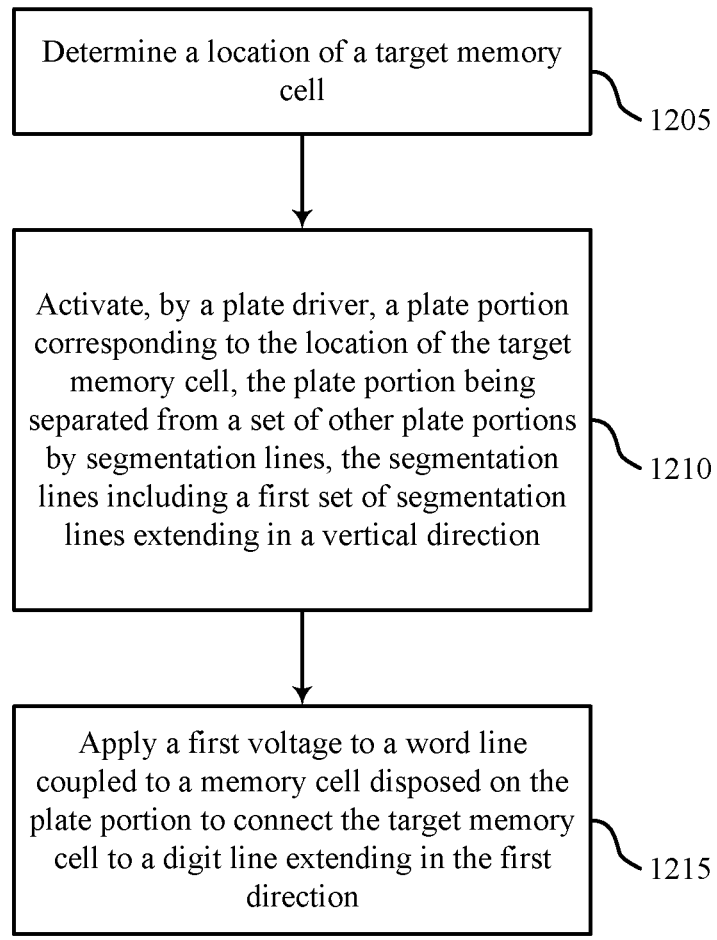

FIG. 12 shows a flowchart illustrating a method 1200 for operating a device with memory plate segmentation in accordance with embodiments of the present disclosure. The operations of method 1200 may be implemented by a memory controller 140 or its components as described herein. For example, the operations of method 1200 may be performed by a memory controller 140 as described with reference to FIG. 1. In some examples, a memory controller 140 may execute a set of codes to control the functional elements of the device to perform the functions described below. Additionally or alternatively, the memory controller 140 may perform aspects of the functions described below using special-purpose hardware.

In some cases, the method may also include determining a location of a target memory cell. In some cases, the method may also include activating, by a plate driver, a plate portion corresponding to the location of the target memory cell, the plate portion being separated from a plurality of other plate portions by segmentation lines, the segmentation lines comprising a first set of segmentation lines extending in a vertical direction. In some cases, the method may also include applying a first voltage to a word line coupled to a memory cell disposed on the plate portion to connect the target memory cell to a digit line extending in the vertical direction.

At block 1205 the memory controller 140 may determine a location of a target memory cell. The operations of block 1205 may be performed according to the methods described herein. In certain examples, aspects of the operations of block 1205 may be performed by a target memory cell locator as described with reference to FIGS. 4, 6, 7, 9, and 10.

At block 1210 the memory controller 140 may activate a plate portion corresponding to the location of the target memory cell, the plate portion being separated from a plurality of other plate portions by segmentation lines, the segmentation lines comprising a first set of segmentation lines extending in a vertical direction. The memory controller 140 may activate the plate portion by sending instructions to a plate driver to apply a voltage to the plate portion corresponding to the location of the target memory cell. The operations of block 1210 may be performed according to the methods described herein. In certain examples, aspects of the operations of block 1210 may be performed by a plate driver activation component as described with reference to FIGS. 4, 6, 7, 9, and 10.

At block 1215 the memory controller 140 may apply a first voltage to a word line coupled to a memory cell disposed on the plate portion to connect the target memory cell to a digit line extending in the vertical direction. The operations of block 1215 may be performed according to the methods described herein. In certain examples, aspects of the operations of block 1215 may be performed by a word line selector as described with reference to FIGS. 4, 6, 7, 9, and 10.

Figure 13:
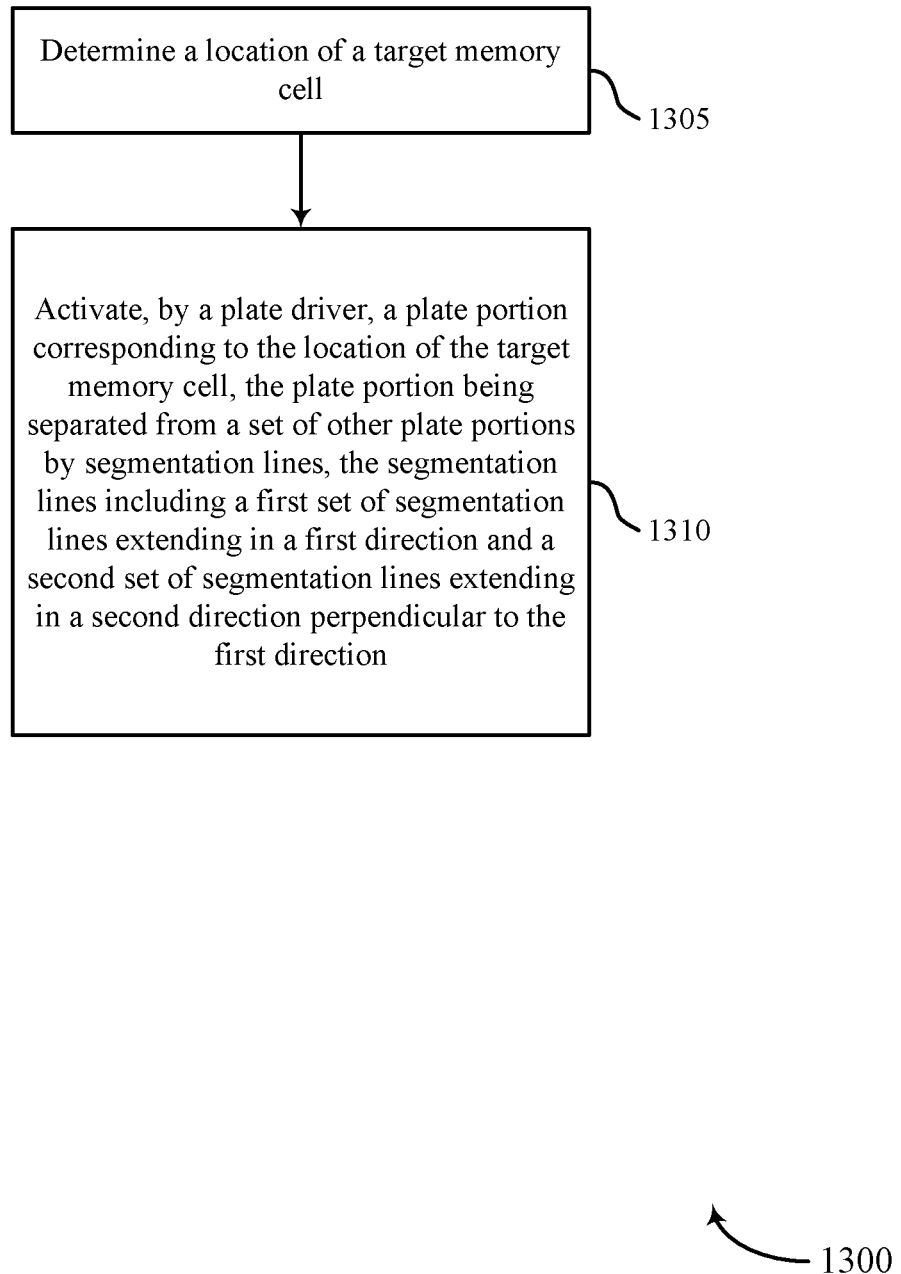

FIG. 13 shows a flowchart illustrating a method 1300 for operating a device with memory plate segmentation in accordance with embodiments of the present disclosure. The operations of method 1300 may be implemented by a memory controller 140 or its components as described herein. For example, the operations of method 1300 may be performed by a memory controller as described with reference to FIGS. 1, 4, 6, 7, 9, and 10. In some examples, a memory controller 140 may execute a set of codes to control the functional elements of the device to perform the functions described below. Additionally or alternatively, the memory controller 140 may perform aspects of the functions described below using special-purpose hardware.

In some cases, the method may also include determining a location of a target memory cell. In some cases, the method may also include activating, by a plate driver, a plate portion corresponding to the location of the target memory cell, the plate portion being separated from a plurality of other plate portions by segmentation lines, the segmentation lines comprising a first set of segmentation lines extending in a first direction and a second set of segmentation lines extending in a second direction perpendicular to the first direction. In some cases, the method may also include activating the plate portion comprises applying a first voltage to a plate line coupled to the plate portion. In some cases, the method may also include applying a first voltage to a word line coupled to a memory cell disposed on the plate portion to connect the target memory cell to a digit line extending in the first direction. In some cases, the method may also include determining a logic value associated with the target memory cell based on a second voltage on the digit line. In some cases, the method may also include applying a second voltage to the digit line to set a logic value associated with the target memory cell.

At block 1305 the memory controller 140 may determine a location of a target memory cell. The operations of block 1305 may be performed according to the methods described herein. In certain examples, aspects of the operations of block 1305 may be performed by a target memory cell locator as described with reference to FIGS. 4, 6, 7, 9, and 10.

At block 1310 the memory controller 140 may activate a plate portion corresponding to the location of the target memory cell, the plate portion being separated from a plurality of other plate portions by segmentation lines, the segmentation lines comprising a first set of segmentation lines extending in a first direction and a second set of segmentation lines extending in a second direction perpendicular to the first direction. The memory controller 140 may activate the plate portion by sending instructions to a plate driver to apply a voltage to the plate portion corresponding to the location of the target memory cell. The operations of block 1310 may be performed according to the methods described herein. In certain examples, aspects of the operations of block 1310 may be performed by a plate driver activation component as described with reference to FIGS. 4, 6, 7, 9, and 10.

Figure 14:
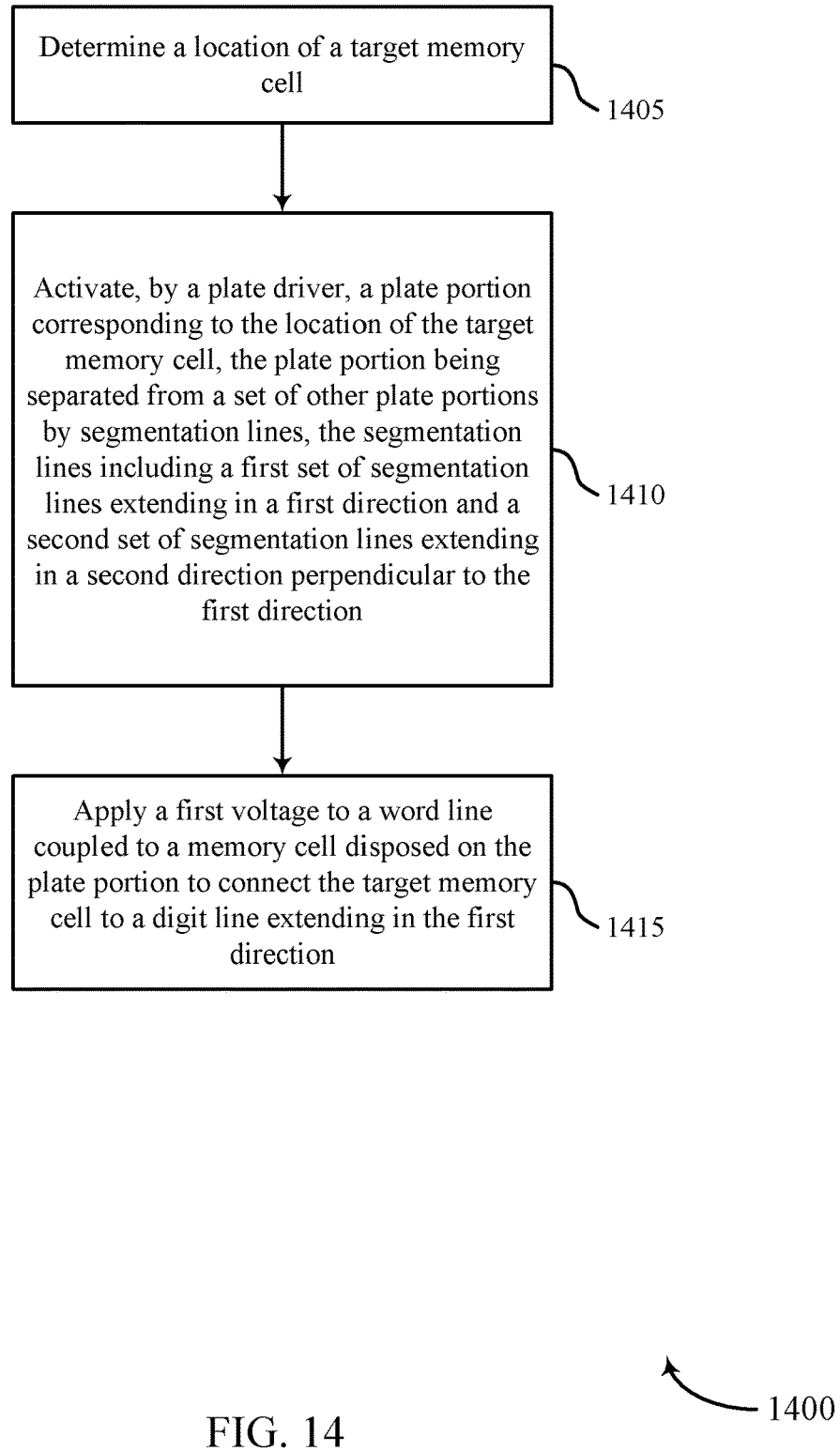

FIG. 14 shows a flowchart illustrating a method 1400 for operating a device with memory plate segmentation in accordance with embodiments of the present disclosure. The operations of method 1400 may be implemented by a memory controller 140 or its components as described herein. For example, the operations of method 1400 may be performed by a memory controller as described with reference to FIGS. 4, 6, 7, 9, and 10. In some examples, a memory controller 140 may execute a set of codes to control the functional elements of the device to perform the functions described below. Additionally or alternatively, the memory controller 140 may perform aspects of the functions described below using special-purpose hardware.

In some cases, the method may also include determining a location of a target memory cell. In some cases, the method may also include activating, by a plate driver, a plate portion corresponding to the location of the target memory cell, the plate portion being separated from a plurality of other plate portions by segmentation lines, the segmentation lines comprising a first set of segmentation lines extending in a first direction and a second set of segmentation lines extending in a second direction perpendicular to the first direction. In some cases, the method may also include applying a first voltage to a word line coupled to a memory cell disposed on the plate portion to connect the target memory cell to a digit line extending in the first direction.

At block 1405 the memory controller 140 may determine a location of a target memory cell. The operations of block 1405 may be performed according to the methods described herein. In certain examples, aspects of the operations of block 1405 may be performed by a target memory cell locator as described with reference to FIGS. 4, 6, 7, 9, and 10.

At block 1410 the memory controller 140 may activate a plate portion corresponding to the location of the target memory cell, the plate portion being separated from a plurality of other plate portions by segmentation lines, the segmentation lines comprising a first set of segmentation lines extending in a first direction and a second set of segmentation lines extending in a second direction perpendicular to the first direction. The memory controller 140 may activate the plate portion by sending instructions to a plate driver to apply a voltage to the plate portion corresponding to the location of the target memory cell. The operations of block 1410 may be performed according to the methods described herein. In certain examples, aspects of the operations of block 1410 may be performed by a plate driver activation component as described with reference to FIGS. 4, 6, 7, 9, and 10.

At block 1415 the memory controller 140 may apply a first voltage to a word line coupled to a memory cell disposed on the plate portion to connect the target memory cell to a digit line extending in the first direction. The operations of block 1415 may be performed according to the methods described herein. In certain examples, aspects of the operations of block 1415 may be performed by a word line selector as described with reference to FIGS. 4, 6, 7, 9, and 10.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An electronic memory apparatus comprising:
   a plurality of plate portions separated by a plurality of segmentation lines, the plurality of segmentation lines comprising a first set of segmentation lines extending in a first direction and segmenting one or more plate lines;
   at least one memory cell disposed on each of the plurality of plate portions, each of the plurality of plate portions being coupled to a same sense component via one of a plurality of digit lines extending in the first direction, wherein the plurality of digit lines are separate from the plurality of segmentation lines; and
   a plate driver component comprising a plurality of plate drivers, each of the plurality of plate drivers being connected to one of the plurality of plate portions by a respective plate line of the one or more plate lines.

2. The electronic memory apparatus of claim 1, wherein the plurality of segmentation lines further comprise a second set of segmentation lines extending in a second direction perpendicular to the first direction.

3. The electronic memory apparatus of claim 1, wherein the at least one memory cell comprises a ferroelectric capacitor.

4. The electronic memory apparatus of claim 1, further comprising a memory controller coupled to the plate driver component.

5. The electronic memory apparatus of claim 4, wherein the memory controller is configured to activate one of the plurality of plate portions based at least in part on a location of a target memory cell.

6. The electronic memory apparatus of claim 5, wherein the memory controller is configured to activate the one of the plurality of plate portions while setting a plurality of other plate portions to a deactivated state.

7. The electronic memory apparatus of claim 1, further comprising:
   a row decoder; and
   a plurality of word lines coupling the row decoder to the at least one memory cell disposed on each of the plurality of plate portions.

8. An electronic memory apparatus comprising:
   a plurality of plate portions separated by a plurality of segmentation lines, the plurality of segmentation lines comprising a first set of segmentation lines extending in a first direction and a second set of segmentation lines extending in a second direction perpendicular to the first direction;
   at least one memory cell disposed on each of the plurality of plate portions, each of the plurality of plate portions being coupled to a same sense component via one of a plurality of digit lines, wherein the plurality of digit lines are separate from the plurality of segmentation lines; and
   a plate driver component comprising a plurality of plate drivers, each of the plurality of plate drivers being connected to at least one of the plurality of plate portions by a respective plate line of a plurality of plate lines.

9. The electronic memory apparatus of claim 8, wherein the at least one memory cell comprises a ferroelectric capacitor.

10. The electronic memory apparatus of claim 8, further comprising a memory controller coupled to the plate driver component.

11. The electronic memory apparatus of claim 10, wherein the memory controller is configured to activate one of the plurality of plate portions based at least in part on a location of a target memory cell.

12. The electronic memory apparatus of claim 8, further comprising:
a row decoder; and
a plurality of word lines coupling the row decoder to the at least one memory cell disposed on each of the plurality of plate portions.

13. The electronic memory apparatus of claim 12, wherein the plurality of word lines comprises at least one dummy line, the at least one dummy line electrically isolated from cells of the apparatus and located adjacent an edge of at least one of the plurality of plate portions.

14. The electronic memory apparatus of claim 8, wherein:
the plurality of plate portions are arranged in a plurality of columns and a plurality, of rows;
each of the plurality of plate drivers is coupled to a plate portion in each of the plurality of rows; and
each of the plurality of plate drivers is coupled to a plate portion in at least two of the plurality of columns.

15. The electronic memory apparatus of claim 14, wherein each of the plurality of plate drivers is coupled to a plate portion in each of the plurality of columns.

16. A method, comprising:
determining a location of a target memory cell; and
activating, by a plate driver, a plate portion corresponding to the location of the target memory cell, the plate portion being separated from a plurality of other plate portions by segmentation lines and coupled to a same sense component as a plurality of plate portions via one of a plurality of digit lines, wherein the plurality of digit lines are separate from the segmentation lines, the segmentation lines comprising a first set of segmentation lines extending in a vertical direction and segmenting one or more plate lines.

17. The method of claim 16, further comprising setting a plurality of other plate portions to a deactivated state.

18. The method of claim 16, wherein activating the plate portion comprises applying a first voltage to a plate line coupled to the plate portion.

19. The method of claim 16, further comprising applying a first voltage to a word line coupled to a memory cell disposed on the plate portion to connect the target memory cell to the digit line extending in the vertical direction.

20. The method of claim 19, further comprising determining a logic value associated with the target memory cell based on a second voltage on the digit line.

21. The method of claim 19, further comprising applying a second voltage to the digit line to set a logic value associated with the target memory cell.

22. A method, comprising:
determining a location of a target memory cell; and
activating, by a plate driver, a plate portion corresponding to the location of the target memory cell, the plate portion being separated from a plurality of other plate portions by segmentation lines and coupled to a same sense component as a plurality of plate portions via one of a plurality of digit lines, wherein the plurality of digit lines are separate from the segmentation lines, the segmentation lines comprising a first set of segmentation lines extending in a first direction and a second set of segmentation lines extending in a second direction perpendicular to the first direction.

23. The method of claim 22, wherein activating the plate portion comprises applying a first voltage to a plate line coupled to the plate portion.

24. The method of claim 22, further comprising applying a first voltage to a word line coupled to a memory cell disposed on the plate portion to connect the target memory cell to Flail the digit line extending in the first direction.

25. The method of claim 24, further comprising determining a logic value associated with the target memory cell based on a second voltage on the digit line or applying a second voltage to the digit line to set a logic value associated with the target memory cell.

26. An electronic memory apparatus, comprising:
a plurality of plate portions separated by a plurality of segmentation lines, the plurality of segmentation lines comprising a first set of segmentation lines extending in a first direction and a second set of segmentation lines extending in a second direction perpendicular to the first direction;
a plate driver component comprising a plurality of plate drivers coupled to the plurality of plate portions, each of the plurality of plate portions being coupled to a same sense component via one of a plurality of digit lines extending in the first direction, wherein the plurality of digit lines are separate from the first set of segmentation lines and the second set of segmentation lines; and
a controller in electronic communication with the plate driver component, wherein the controller is operable to cause the apparatus to:
identify a location of a target memory cell; and
activate one of the plurality of plate portions corresponding to the location of the target cell.

27. The apparatus of claim 26, wherein the controller is further operable to cause the apparatus to apply a first voltage to a word line coupled to the target memory cell to connect the target memory cell to a digit line.

28. The apparatus of claim 27, wherein the controller is further operable to cause the apparatus to determine a logic value associated with the target memory cell based on a second voltage on the digit line.

29. The apparatus of claim 27, wherein the controller is further operable to cause the apparatus to apply a second voltage to the digit line to set a logic value associated with the target memory cell.

30. The apparatus of claim 1, wherein the plate driver component is coupled with each of the plurality of plate portions.

31. The apparatus of claim 1, wherein each of the plurality of plate portions is common to a respective plurality of memory cells and is coupled with at least one plate line of the one or more plate lines.

* * * * *